US011003807B2

(12) United States Patent
Davis et al.

(10) Patent No.: US 11,003,807 B2
(45) Date of Patent: May 11, 2021

(54) TECHNIQUES FOR GENERATING MATERIALS TO SATISFY DESIGN CRITERIA

(71) Applicant: AUTODESK, INC., San Rafael, CA (US)

(72) Inventors: Mark Thomas Davis, Mill Valley, CA (US); Michael Bergin, El Cerrito, CA (US)

(73) Assignee: AUTODESK, INC., San Rafael, CA (US)

( * ) Notice: Subject to any disclaimer, the term of this patent is extended or adjusted under 35 U.S.C. 154(b) by 286 days.

(21) Appl. No.: 14/951,366

(22) Filed: Nov. 24, 2015

(65) Prior Publication Data

US 2016/0147217 A1    May 26, 2016

Related U.S. Application Data

(60) Provisional application No. 62/084,490, filed on Nov. 25, 2014.

(51) Int. Cl.
*G06F 30/20* (2020.01)
*G05B 19/4097* (2006.01)
(Continued)

(52) U.S. Cl.
CPC ......... *G06F 30/20* (2020.01); *G05B 19/4097* (2013.01); *G06F 3/0481* (2013.01);
(Continued)

(58) Field of Classification Search
None
See application file for complete search history.

(56) References Cited

U.S. PATENT DOCUMENTS 5,510,995 A    4/1996 Oliver
8,392,160 B2   3/2013 Brincat et al.
(Continued)

FOREIGN PATENT DOCUMENTS

CN    101038599 A    9/2007
JP    05-081355 A    4/1993

OTHER PUBLICATIONS

Non-final Office Action for U.S. Appl. No. 14/951,310 dated Jun. 7, 2018, 21 pages.

(Continued)

*Primary Examiner* — Khaja Ahmad
(74) *Attorney, Agent, or Firm* — Artegis Law Group, LLP

(57) ABSTRACT

A design application is configured to determine design problem geometry and design criteria associated with a design problem to be solved. Based on this information, the design application identifies one or more design approaches to creating a custom material having specific material attributes needed to solve the design problem. The design application then executes the design approaches to create material designs that reflect one or more custom materials. With these designs as input, a manufacturing machine may then construct physical instances of those custom materials. A given custom material may have a unique combination of material attributes potentially not found among existing materials. Additionally, a design fabricated from a custom material may better satisfy the design criteria than a design fabricated from a known material.

21 Claims, 8 Drawing Sheets

(51) Int. Cl.
| | |
|---|---|
| *G06F 16/44* | (2019.01) |
| *G06F 30/00* | (2020.01) |
| *G06F 3/0481* | (2013.01) |
| *G06F 3/0484* | (2013.01) |
| *G06T 15/10* | (2011.01) |
| *G06T 19/20* | (2011.01) |

(52) U.S. Cl.
CPC ........ *G06F 3/04847* (2013.01); *G06F 16/444* (2019.01); *G06F 30/00* (2020.01); *G06T 15/10* (2013.01); *G06T 19/20* (2013.01); *G05B 2219/32089* (2013.01); *G05B 2219/35012* (2013.01); *G05B 2219/35021* (2013.01); *G05B 2219/49301* (2013.01); *Y02P 80/40* (2015.11)

(56) References Cited

U.S. PATENT DOCUMENTS

| | | | |
|---|---|---|---|
| 8,589,125 | B2 | 11/2013 | Mori et al. |
| 8,666,702 | B2 | 3/2014 | Schell |
| 8,818,769 | B2 | 8/2014 | Trainer et al. |
| 9,785,727 | B1 | 10/2017 | Wilson |
| 2003/0210241 | A1 | 11/2003 | Minami et al. |
| 2005/0038821 | A1* | 2/2005 | Wallen ............... G05B 19/4097 |
| 2005/0081354 | A1* | 4/2005 | Motzno ..................... B23P 6/00 29/402.12 |
| 2006/0058985 | A1 | 3/2006 | Arslan et al. |
| 2006/0066609 | A1 | 3/2006 | Iodice et al. |
| 2007/0078634 | A1 | 4/2007 | Krishnapillai |
| 2007/0118243 | A1* | 5/2007 | Schroeder .............. B33Y 50/00 700/118 |
| 2008/0222110 | A1 | 9/2008 | Hayashi |
| 2008/0319928 | A1 | 12/2008 | Hashimoto et al. |
| 2009/0306801 | A1* | 12/2009 | Sivak .................... A61F 5/0111 700/98 |
| 2010/0088657 | A1* | 4/2010 | Bantas .................... G06F 30/39 716/136 |
| 2013/0170171 | A1* | 7/2013 | Wicker ............... H01L 21/4846 361/809 |
| 2013/0199748 | A1* | 8/2013 | Christensen ............ C22C 14/00 164/494 |
| 2013/0233618 | A1* | 9/2013 | Nakano .................... H01R 4/04 174/94 R |
| 2014/0108953 | A1 | 4/2014 | Greene et al. |
| 2015/0099059 | A1* | 4/2015 | Harjee ....................... B41J 2/07 427/8 |
| 2015/0324489 | A1 | 11/2015 | Onodera |
| 2015/0356207 | A1* | 12/2015 | Reitman ................. G06F 30/00 703/1 |
| 2015/0362898 | A1* | 12/2015 | Potter ................ G05B 19/4099 700/98 |

OTHER PUBLICATIONS

Arieff, A. 2013. New Forms that Function Better. MIT Technology Review http://www.technologyreview.com/review/517596/new-formsthat-function-better/ pp. 1-10.

Bertini E. Dell'Aquila, L., & Santucci, G. 2005. "SpringView: cooperation of radviz and parallel coordinates for view optimization and clutter reduction". In Coordinated and Multiple Views in Exploratory Visualization. (8 pages).

Draper, G., Livnat, Y., & Riesenfeld, R. F. 2009. "A survey of radial methods for information visualization". In Visualization and Computer Graphics. pp. 1-45.

Dunne, C. and Shneiderman, B. 2013. "Motif simplification: improving network visualization readability with fan, connector, and clique glyphs". In Proc CHI '13 (14 pages).

Lager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12.

Flager F, Welle B, Bansal P, Soremekun G, Haymaker J. 2009. "Multidisciplinary process integration and design optimization of a classroom building". Journal of Information Technology in Construction, vol. 14. 595-612.

Gerber, D. J., Lin, S.-H., Pan, B. and Solmaz, A. S. 2012. "Design optioneering: multi-disciplinary design optimization through parameterization, domain integration and automation of a genetic algorithm". In Proc. Symposium an Simulation for Architecture and Urban Design, Society for Computer Simulation International. (pp. 23-30).

Graham, M., & Kennedy, J. 2003. "Using curves to enhance parallel coordinate visualisations". In Information Visualization, 2003.

Grossman, T., Matejka, T. and Fitzmaurice, G. 2010. "Chronicle: capture, exploration, and playback of document workflow histories". In Proc UIST '10. (pp. 143-152).

Hauser, H., Ledermann, F., & Doleisch, H. 2002. "Angular brushing of extended parallel coordinates". In Information Visualization, 2002. (4 pages).

Holzer, D., Hough, R. and Burry, M. 2007. "Parametric Design and Structural Optimisation for Early Design Exploration". International, Journal of Architectural Computing, vol. 5, 4. 625-643.

Lunzer, A. and Hornbæk, K. 2008. "Subjunctive interfaces: Extending applications to support parallel setup, viewing and control of alternative scenarios". ACM Transactions on Computer-Human Interaction vol. 14, 4. 1-17.

Maile T. Fischer, M., Bazjanac, V. 2007. "Building energy performance simulation tools—a life-cycle and interoperable perspective". Working Paper. Center for Integrated Facility Engineering, Stanford University. (47 pages).

Marks, J., Andalman, B., Beardsley, P. A., Freeman, W., Gibson, S., Hodgins, J., . . . & Shieber, S. 1997. "Design galleries: A general approach to setting parameters for computer graphics and animation". In Proc. of the 24th annual conference on Computer graphics and interactive techniques.

Shah, J., Vergas-Hernandez, N., Smith, S. 2003. "Metrics for measuring ideation effectiveness". Design Studies vol. 24. 111-134.

Shneiderman, B. 1996. "The eyes have it: A task by data type taxonomy for information visualizations". In Proc. of IEEE Symposium on Visual Languages. (pp. 336-343).

Shneiderman, B., Hewett, T., Fischer, G., Jennings, P. 2006. et al. "Creativity Support Tools: Report from a US National Science Foundation Sponsored Workshop". International Journal of Human Computer Interaction, 20, 2. 61-77.

Steed, C. A., Fitzpatrick, P. J., Jankun-Kelly, T. J., Yancey, A. N., & Swan II, J. E. 2009. "An interactive parallel coordinates technique applied to a tropical cyclone climate analysis". Computers & Geosciences. (pp. 1-40).

Strauss, A. and Corbin, J. 1998. "Basics of qualitative research: Techniques and procedures for developing jrounded theory". Thousand Oaks, CA: Sage. (133 pages).

Terry, M. Mynatt, E.D., Nakakoji, K, and Yamamoto, Y. 2004. "Variation in element and action: supporting simultaneous development of alternative solutions". In Proc CHI '04 (pp. 711-718).

Thibodeau, T. 2013. "U.S. makes a Top 10 supercomputer available to anyone who can 'boost' America". In www.computerworld.com.

Ward M. O. 1994 "Xmdvtool: Integrating multiple methods for visualizing multivariate data". In Proc. of the Conference on Visualization. (9 pages).

Ward, M. O. 2002. "A taxonomy of glyph placement strategies for multidimensional data visualization". Information Visualization. (pp. 194-210).

Wegman, E. J. 1990. "Hyperdimensional data analysis using parallel coordinates". Journal of the American Statistical Association. (pp. 664-675).

Wong, P. C., & Bergeron, R. D. 1994. "30 Years of Multidimensional Multivariate Visualization". In Scientific Visualization. (pp. 1-30).

Non-Final Office Action received in U.S. Appl. No. 14/951,297, dated Dec. 9, 2019, 30 pages.

Final Office Action received in U.S. Appl. No. 14/951,310, dated Dec. 12, 2019, 39 pages.

Non-Final Office Action received in U.S. Appl. No. 14/951,338, dated Dec. 11, 2019, 32 pages.

(56) References Cited

OTHER PUBLICATIONS

Final Office Action received in U.S. Appl. No. 14/951,349, dated Oct. 24, 2019, 23 pages.
Final Office Action received for U.S. Appl. No. 14/951,297, dated Apr. 22, 2020, 17 pages.

* cited by examiner

TECHNIQUES FOR GENERATING MATERIALS TO SATISFY DESIGN CRITERIA

CROSS-REFERENCE TO RELATED APPLICATIONS

This application claims the benefit of U.S. provisional patent application titled "Dreamcatcher: Approaches for Design Variation," filed on Nov. 25, 2014 and having Ser. No. 62/084,490. The subject matter of this related application is hereby incorporated herein by reference.

BACKGROUND OF THE INVENTION

Field of the Invention

Embodiments of the present invention relate generally to engineering design and, more specifically, to techniques for generating materials to satisfy design criteria.

Description of the Related Art

In a conventional engineering workflow, an engineer uses a computer-aided design (CAD) tool to design and draft physical parts to meet specific design criteria. The engineer then selects a material from which to fabricate the part and initiates the process of manufacturing the part using the selected material. Each material available for manufacturing may have different material attributes. Thus, when a given physical part is manufactured from a specific material, that part has particular static and dynamic attributes that derive from both the geometry of the part and the attributes of the material of manufacture.

In some cases, a design having a particular geometry can be or must be manufactured from a specific material in order to generate a physical part that meets the design criteria. However, in many other cases, the particular geometry is such that there are no specific materials available having the physical properties required to generate a physical part that can meet the design criteria. For example, a certain design may have a truss geometry that, based on design criteria, must support a minimum load without exceeding a maximum weight. However, for that particular truss geometry, there may not be any materials that offer the specific strength and density required by the truss to meet the design criteria.

When no suitable materials can be identified for a given design, engineers are forced to start the design process over and generate a completely new design. If the new design still cannot be manufactured from an existing material and meet the design criteria, the design process must be repeated yet again. This process can become repetitive, tedious, and time consuming.

As the foregoing illustrates, what is needed in the art is a more effective approach to identifying materials for fabricating physical parts to satisfy design criteria.

SUMMARY OF THE INVENTION

Various embodiments of the present invention sets forth a non-transitory computer-readable medium including instructions that, when executed by a processor, cause the processor to generate a material, by performing the steps of generating a material design, based on a design problem described in a problem specification, that includes instructions for fabricating a custom material that satisfies at least one design criterion associated with the design problem, and causing a manufacturing machine to fabricate the custom material based on the material design.

At least one advantage of this approach is that engineers no longer need to rely solely on pre-existing materials when creating designs to solve specific design problems.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
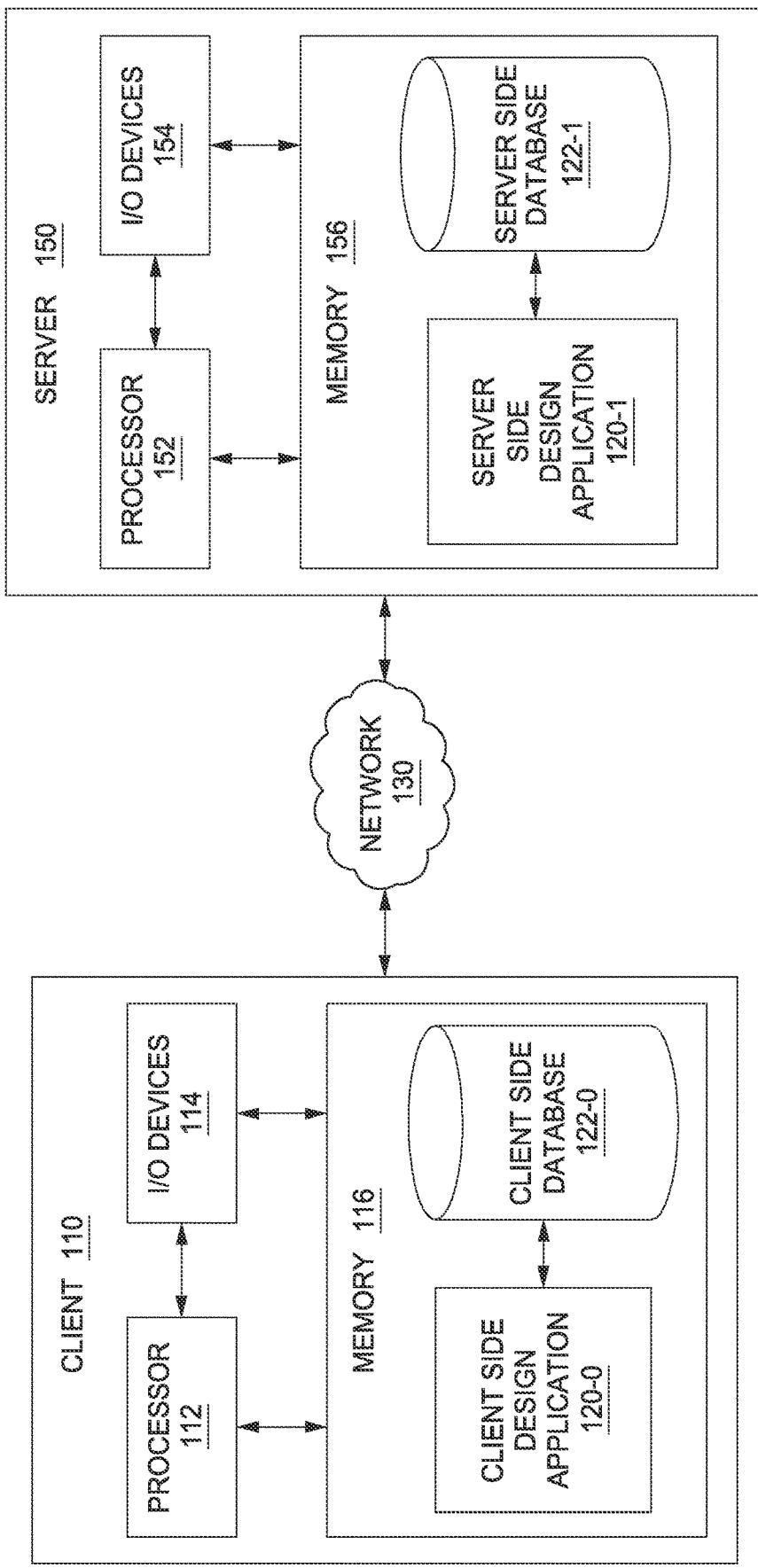
FIG. 1 illustrates a system configured to implement one or more aspects of the present invention.

FIG. 1 illustrates a system 100 configured to implement one or more aspects of the present invention. As shown, system 100 includes a client 110 coupled via a network 130 to a server 150. Client 110 may be any technically feasible variety of client computing device, including a desktop computer, laptop computer, mobile device, and so forth. Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a mixture of the two, a portion of a datacenter, and so forth.

Client 110 includes processor 112, input/output (I/O) devices 114, and memory 116, coupled together. Processor 112 may be any technically feasible form of processing device configured process data and execute program code. Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive and provide input and output, respectively, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth.

Memory 116 includes client-side design application 120-0 and client-side database 122-0. Client-side design application 120-0 is a software application that, when executed by processor 112, causes processor 112 to design a custom material having specific material attributes. In doing so, client-side design application 120-0 may access client-side database 122-0. Client-side design application 122-0 may also interoperate with a corresponding design application that resides within server 150 and access a database that also resides on server 150, as described in greater detail below.

Server 150 includes processor 152, I/O devices 154, and memory 156, coupled together. Processor 152 may be any technically feasible form of processing device configured to process data and execute program code, including a CPU, a GPU, an ASIC, an FPGA, and so forth. I/O devices 114 may include devices configured to receive input, devices configured to provide output, and devices configured to both receive and provide input and output, respectively.

Memory 156 may be any technically feasible storage medium configured to store data and software applications, including a hard disk, a RAM module, a ROM, and so forth. Memory 156 includes server-side design application 120-1 and server-side database 122-1. Server-side design application 120-1 is a software application that, when executed by processor 156, causes processor 152 to design a custom material having specific material attributes. In doing so, server-side design application 120-1 may access server-side database 122-1. Server-side design application 122-1 may also interoperate with client-side design application 120-0 and access client-side database 122-0.

In operation, client-side design application 120-0 and server-side design application 120-1 cooperate to implement any and all of the inventive functionality described herein. In doing so, either one or both of client-side design application 120-0 and server-side design application 120-1 may access either one or both of client-side database 122-0 and server-side database 122-1. Generally, client-side design application 120-0 and server-side design application 120-1 represent different portions of single distributed software entity. Thus, for simplicity, client-side design application 122-0 and server-side design application 122-1 will be collectively referred to herein as design application 120. Similarly, client-side database 122-0 and server-side database 122-1 represent different portions of a single distributed storage entity. Therefore, for simplicity, client-side database 122-0 and server-side database 122-1 will be collectively referred to herein as database 122.

As described in greater detail below in conjunction with FIG. 2, design application 120 is configured to interact with an end-user in order to synthesize a problem specification for a design problem. Then, design application designs a custom material that can be used to create engineering designs that solve the design problem. An advantage of this approach is that a spectrum of design options need not be limited by the absence of real-world materials that have particular attributes, because design application 120 is capable of simply creating new materials having those particular attributes, as also explained in conjunction with FIG. 3A-3B.

Figure 2:
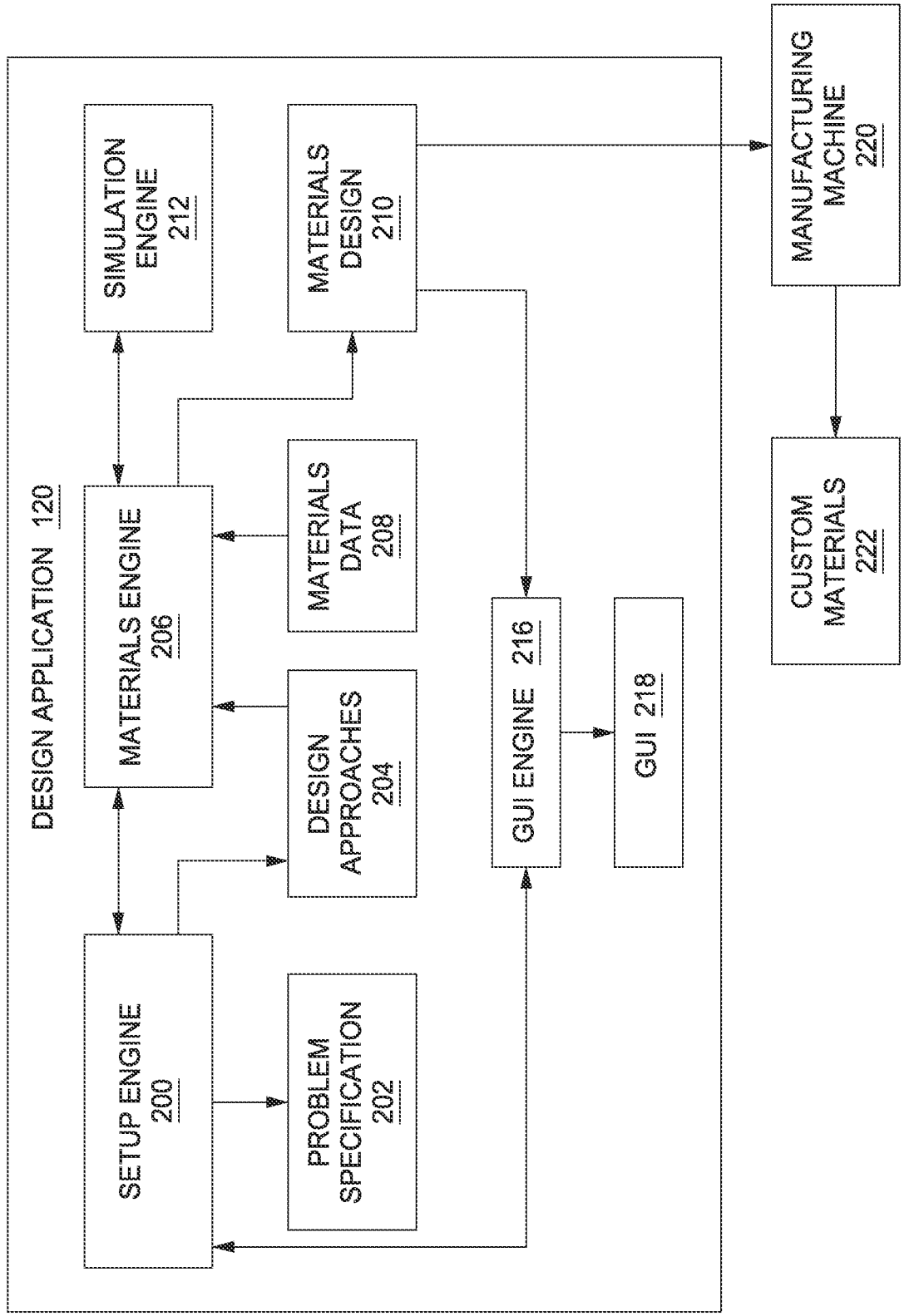
FIG. 2 is a more detailed illustration of the design application of FIG. 1, according to various embodiments of the present invention.

FIG. 2 is a more detailed illustration of the design application of FIG. 1, according to various embodiments of the present invention. As shown, design application 120 includes without limitation, a setup engine 200, a problem specification 202, design approaches 204, a materials engine 206, materials data 208, material designs 210, a simulation engine 212, a graphical user interface (GUI) engine 216, and a GUI 218. Design application 120 is coupled to a manufacturing machine 220 that is configured to generate custom materials 222.

Setup engine 202 is configured to generate problem specification 202 and design approaches 204. Materials engine 204 is configured to process design approaches 204 and materials data 208 to generate material designs 210. Simulation engine 212 is configured to simulate virtual instances of materials associated with material designs 210. GUI engine 216 is configured to generate GUI 218. An end-user may interact with setup engine 200, materials engine 204, simulation engine 212, and GUI engine 216 via GUI 214.

Setup engine 200 provides various tools that allow the end-user to define a design problem to be solved within a design space associated with a simulated three-dimensional (3D) environment. The end-user may interact with setup engine 200, via GUI 216, to define design problem geometry, design objectives, design constraints, boundary conditions, and other data associated with the design problem. Setup engine 200 synthesizes this data in problem specification 202. An example of this process is described in greater detail below in conjunction with FIGS. 4-5.

Problem specification 202 is a data structure that embodies all of the design problem information received via interactions with the end-user. For example, problem specification 202 could reflect a 3D environment that includes specific locations where certain forces are to be supported, within precise volumetric constraints, under particular weight limitations.

Setup engine 200 is configured to analyze problem specification 202 and to then identify, within database 122, one or more design approaches 204 applicable to the design problem outlined in problem specification 202. A given design approach 204 represents a procedure for creating a design for a material having specific material attributes and/or combinations of attributes. For example, a design approach 204 could include a lattice optimization algorithm that creates lattices that could have a range of physical attributes.

Materials engine 206 is configured to execute each design approach 204 to generate material designs 210. Each material design 210 represents instructions for generating a custom material. When generating material designs 210, materials engine 206 may generate a wide range of possible design candidates, and then simulate each such candidate via simulation engine 212. Simulation engine 212 relies on materials data 208 to perform simulations. Materials data 208 defines various attributes of existing materials, including density, thermal conductivity, strength, hardness, Young's modulus, Poisson Ratio, ductility, and so forth. In some cases, a material design 210 may indicate that two or more existing materials should be combined in a particular manner. Simulation engine 212 may predict the attributes of such a material based, at least in part, on materials data 208.

When a given candidate design has material attributes that meet the design criteria, materials engine 206 includes that design in material designs 210. In one embodiment, materials engine 206 creates a wide range of candidate geometry composed of simulated materials derived from candidate material designs, and then simulates that candidate geometry via simulation engine 212 to determine whether the design criteria is satisfied. Then, materials engine 206 may identify the candidate geometry and candidate material design as solving the design problem.

Once materials engine 206 generates material designs 210, design application 120 may then transmit those designs to manufacturing machine 220. Manufacturing machine 220 could be a stereolithography machine, a fused deposition modeling machine, a selective laser sintering machine, an electronic beam melting machine, a laminated object manufacturing machine, a metal alloy fabrication machine, or any other type of 3D printing machine. Manufacturing machine 220 is configured to execute commands included in material designs 210 to generate custom materials 222. Each custom material 22 has a particular combination of material attributes designed to effectively solve the design problem associated with design specification 202. In generating custom materials 222, design application 120 may create materials having fundamentally different combinations of material attributes compared to any pre-existing materials, as described in greater detail below in conjunction with FIG. 3A.

Figure 3A:
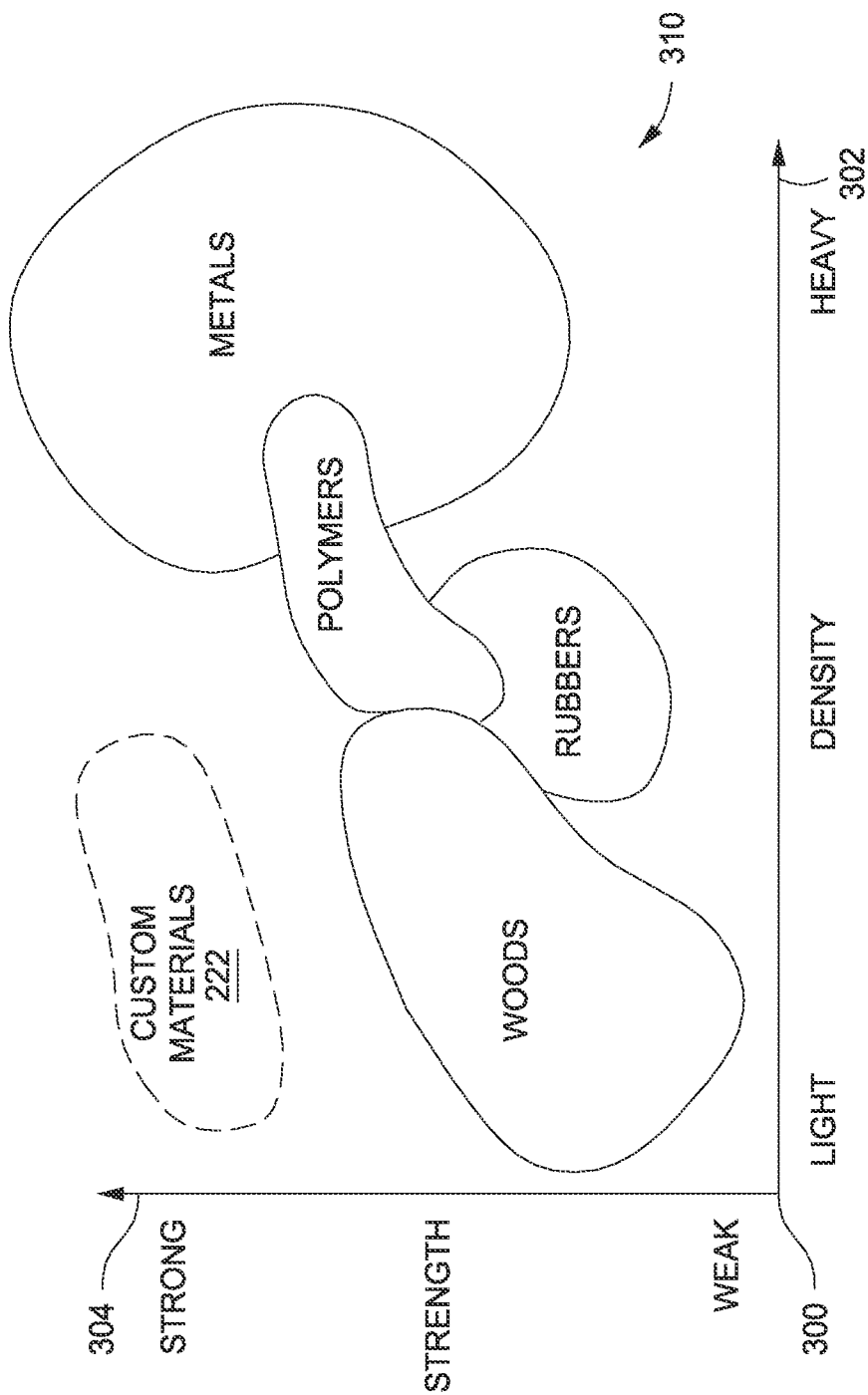
FIG. 3A is an exemplary plot illustrating a custom material having attributes beyond those associated with existing materials, according to various embodiments of the present invention.

FIG. 3A is an exemplary plot illustrating a custom material having attributes beyond those associated with known materials, according to various embodiments of the present invention. As shown, plot 300 includes an X-axis 302 corresponding to density and a Y-axis 304 corresponding to strength. Plot 300 shows various regions of existing materials 310 and a region of custom materials 222. Each material within a given region 310 has a particular density value and a particular strength value. Thus, each region 310 represents a range of density and strength attributes associated with a different type of real-world material. For example, metals are shown to be both dense and strong, occupying higher ranges of density and strength. Conversely, woods are shown to be comparatively light and weak, occupying lower ranges of density and strength. Custom materials 222 have attributes that fall outside of regions 310, and thus have unique combinations of density and strength, in the example shown.

In certain circumstances, an existing material, such as a metal or a wood, may not be suitable for use in manufacturing a particular design. For example, an existing material may not confer sufficient strength for a given density of material. In some instances, the particular material attributes needed to fabricate a design that meets the design criteria can be determined based on the geometry of that design. For example, suppose problem specification 202 indicated that a particular volume of material was needed to support a specific load, and could not exceed a given amount of deformation. Based on well-known physical laws, these design objectives and design constraints provide sufficient information to identify the particular material attributes needed in a material. In the above example, Hooke's law of springs would allow the stiffness of the needed material to be computed based on the applied load and maximum deformation.

Materials engine 206 is configured to analyze problem specification 202, in the manner described above, in order to determine the specific combination of material attributes needed for a material that could potentially yield a feasible design. Those material attributes could correspond, for example, to the unique combination of strength and density associated with custom materials 222 shown in FIG. 3A, although persons skilled in the art will understand that custom materials 222 may have any combination of material attributes. In performing this technique, materials engine 206 may generate a simulated material having the specific combination of material attributes needed. Then, by selecting and executing a design approach 204, materials engine 206 may generate a material design 210 having the needed attributes of that simulated material.

An important advantage of this approach is that designs are no longer limited by the material attributes associated with real-world materials, and so engineers need not adjust the geometry of a design so that a particular real-world material can be used. Instead, the engineer can rely on design application 120 to generate the suitable material for the design.

Figure 3B:
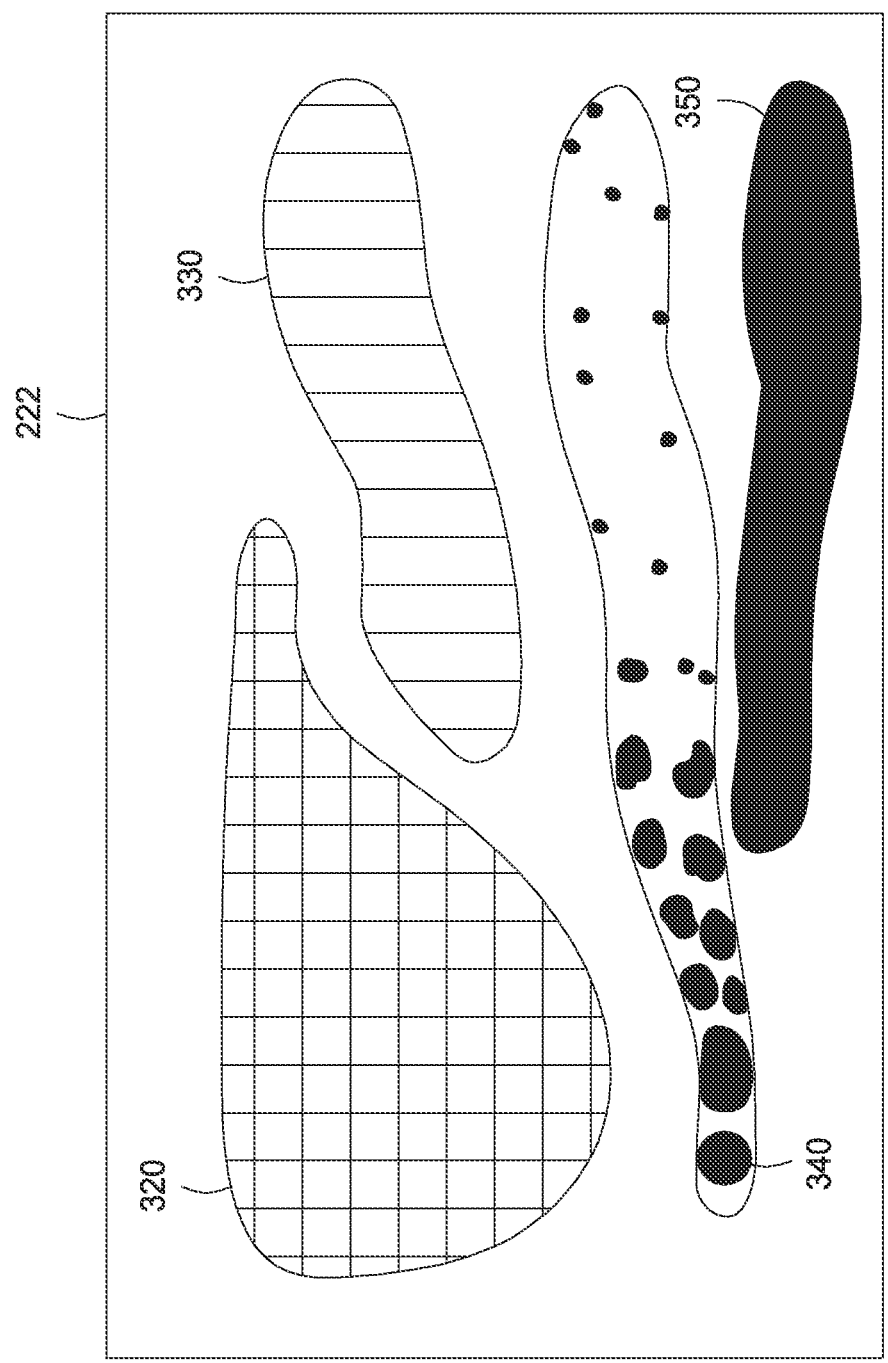
FIG. 3B is an exemplary custom material that includes amorphous substructures having distinct material attributes, according to various embodiments of the present invention.

FIG. 3B is an exemplary custom material that includes amorphous substructures having distinct material attributes, according to various embodiments of the present invention. As shown, custom material 222 includes substructures 320, 330, 340, and 350. Each substructure shown may be formed to have a particular combination of material attributes, thereby imbuing custom material 222 with a unique set of material attributes. In addition, each substructure shown may be formed with any material attribute having a gradient in a given direction. For example, substructure 340 could have a density gradient from left to right.

Figure 4:
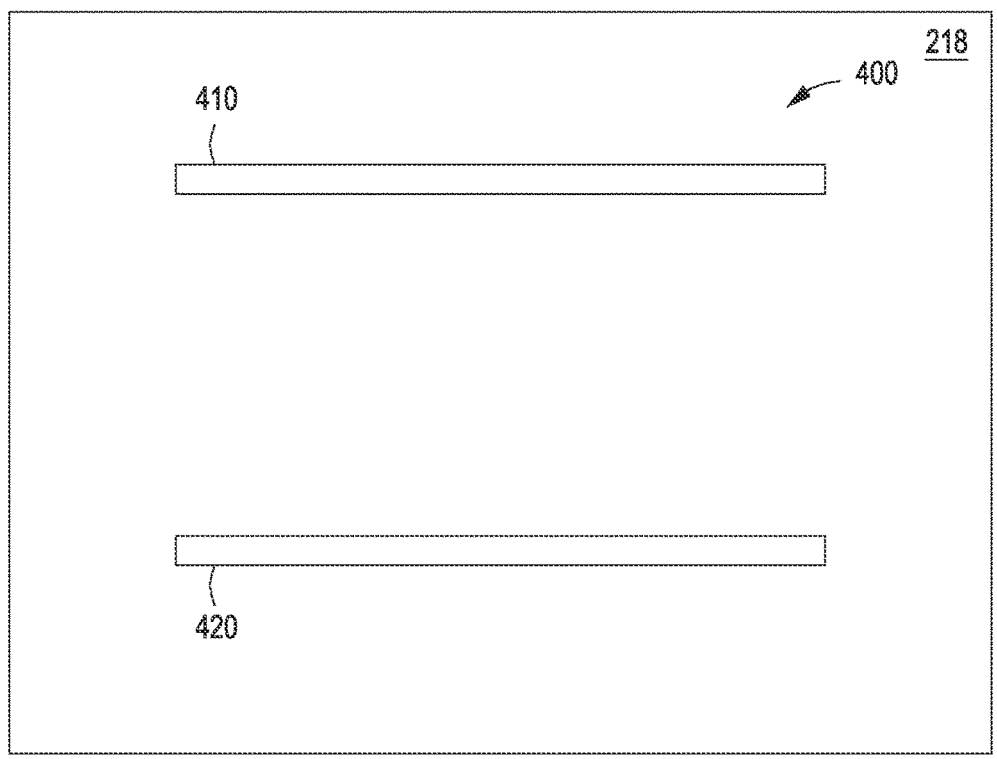
FIG. 4 illustrates a design space where design problem geometry can be generated, according to various embodiments of the present invention.
Figure 5:
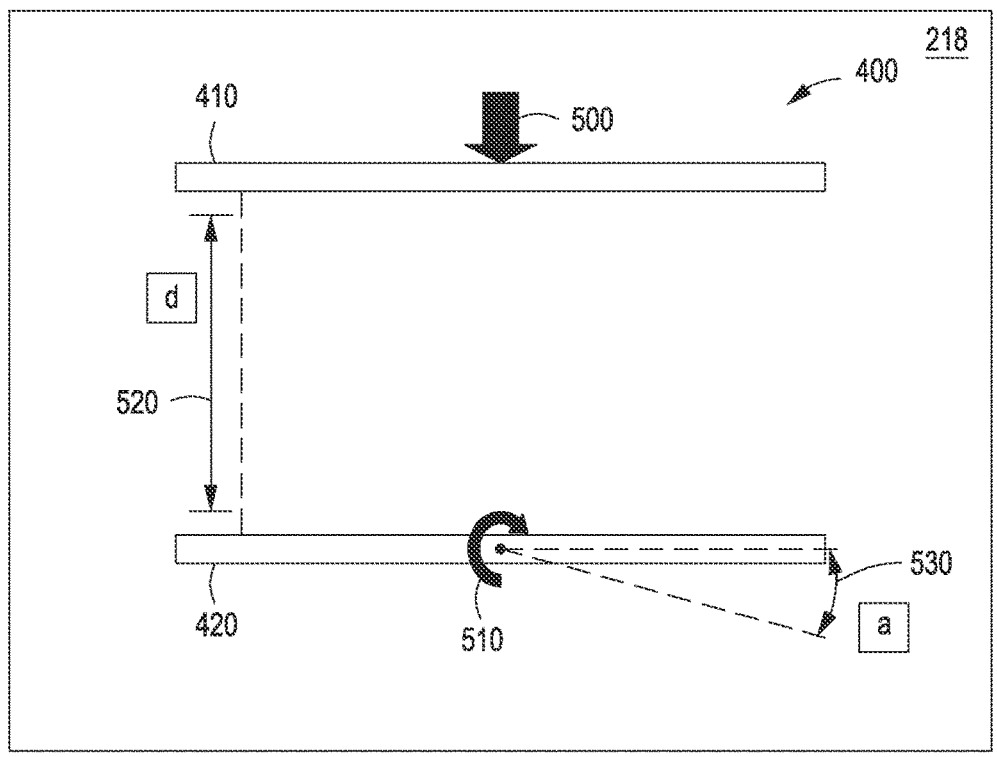
FIG. 5 illustrates different design criteria applied within the design space of FIG. 4, according to various embodiments of the present invention.
Figure 6:
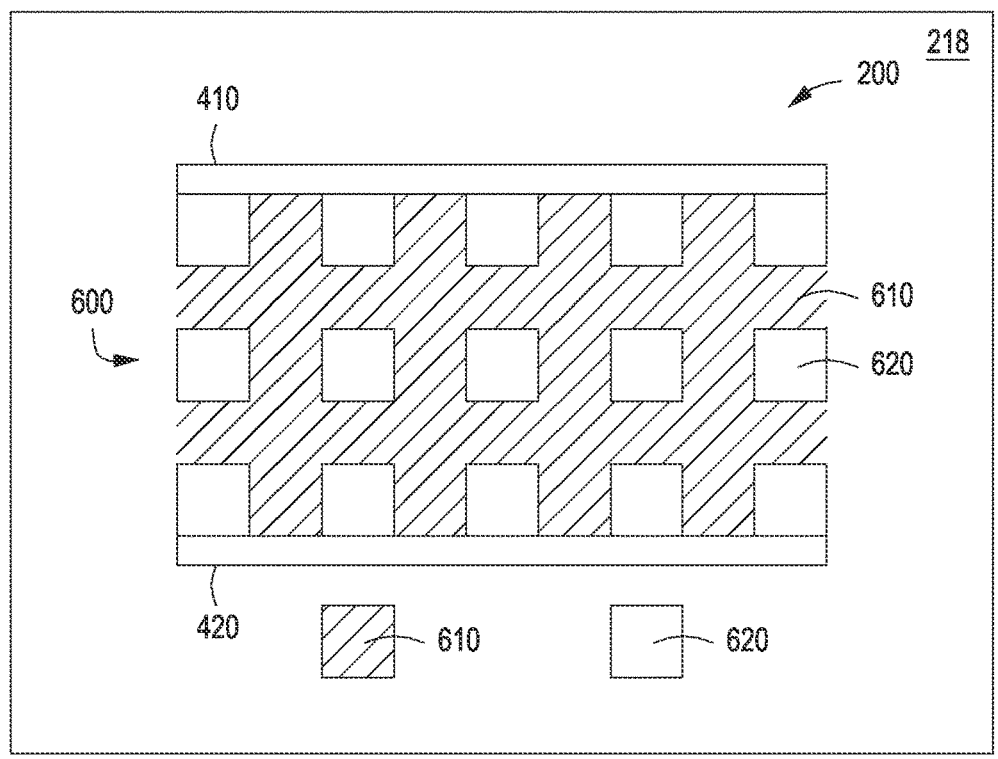
FIG. 6 illustrates a material design created using a lattice approach, according to various embodiments of the present invention.
Figure 7:
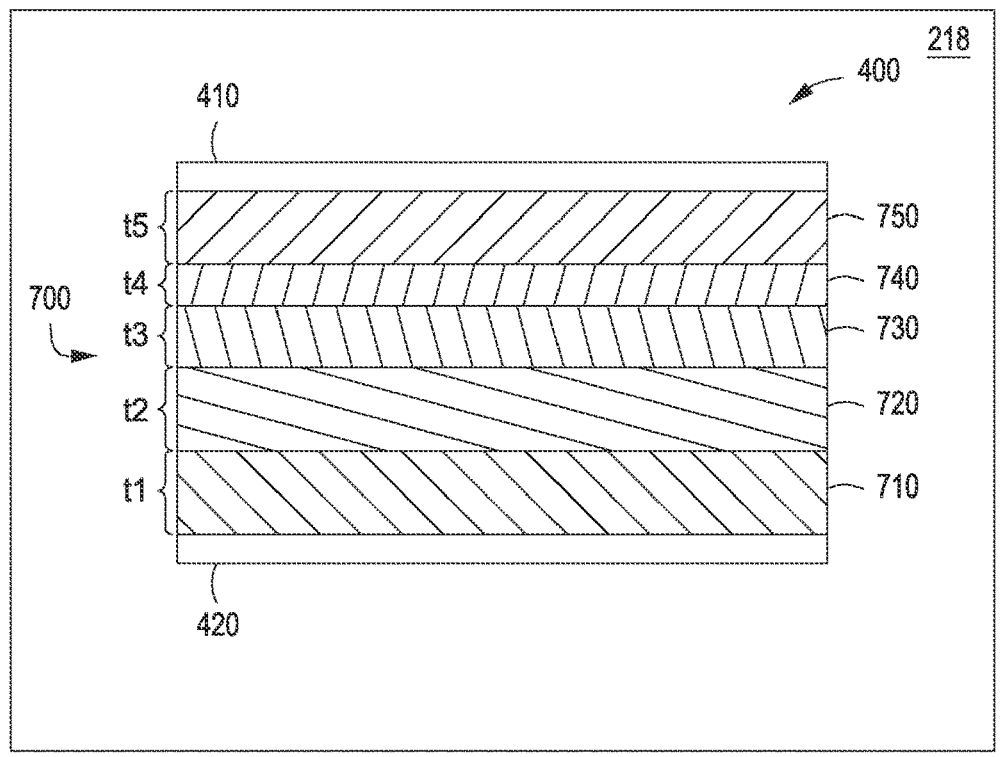
FIG. 7 illustrates a material design created using a composite skin approach, according to various embodiments of the present invention.
Figure 8:
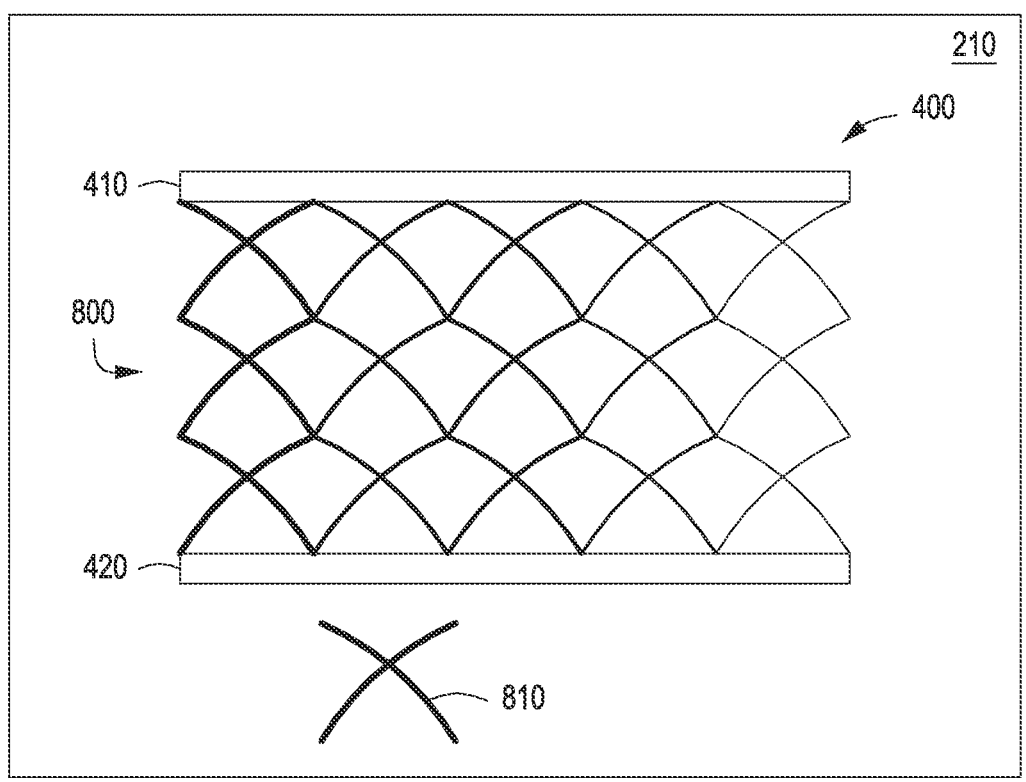
FIG. 8 illustrates a material design created using a unit cell approach, according to various embodiments of the present invention.

Each substructure may be any technically feasible type of material and may be bonded or otherwise coupled to other substructures via any technically feasible approach. Materials engine 206 is configured to generate custom material 222 by iteratively depositing different materials in a simulated environment and then testing the resultant material design to determine whether a physical instance of that material potentially has a target set of attributes. Then, when a suitable combination of materials is determined, materials engine 206 causes manufacturing machine 220 to generate custom material 222 based on the associated material design. Materials engine 206 is configured to implement a wide variety of techniques for creating custom material 222 based on material designs, as described in greater detail below in conjunction with FIGS. 4-8. FIGS. 4-5, described below, illustrate how an exemplary design problem is defined in problem specification 202, and FIGS. 6-8 illustrate exemplary execution of design approaches 204 for generating material designs 210.

FIG. 4 illustrates a design space where design problem geometry can be generated, according to various embodiments of the present invention. As shown, a design space 400 includes planes 410 and 420. GUI engine 216 may render design space 400 within GUI 218. Planes 410 and 420 generally represent geometry associated with a design problem. Setup engine 200 generates planes 410 and 420 within design space 400 based on interactions with the end-user. Setup engine 200 then updates problem specification 202 to reflect design space 400. Setup engine 200 may also add various design criteria to design space 400, as described below in conjunction with FIG. 5.

FIG. 5 illustrates different design criteria applied within the design space of FIG. 4, according to various embodiments of the present invention. As shown, design space 400 includes a force 500 applied to plane 410, a torque 510 applied to plane 420, a distance constraint 520 between planes 410 and 420, and an angle constraint 530 on plane 420. Design space 400 also includes a design objective (not shown) indicating that a feasible design will couple boundaries 410 and 420 to one another.

Force 500 represents a boundary condition to be balanced by a feasible design. Torque 510 also represents a boundary condition to be balanced by a feasible deign. Distance constraint 520 indicates that, when loaded by force 500, plane 410 should not approach within distance d of plane 420, when loaded by torque 510. Angle constraint 530 indicates that plane 420 should not rotate greater than angle a when loaded with torque 510. Generally, the various forces, torques, constraints, and objectives discussed herein define the design problem to be solved.

Setup engine 200 synthesizes this information within problem specification 202. Then, based on that specification, setup engine 200 identifies design approaches 204 that can be used to generate a custom material between planes 410 and 420 having specific material properties that allow the various design criteria discussed above to be met. FIGS. 6-8 illustrate exemplary custom materials created using various design approaches.

FIG. 6 illustrates a material design created using a lattice approach, according to various embodiments of the present invention. As shown, a material design 600 includes materials 610 and 620. Each of materials 610 and 620 may be any material having any technically feasible combination of material attributes. Material 610 generally assumes geometry associated with a 3D lattice, while material 620 fills gaps between lattice members formed by material 610.

Materials engine 206 generates material design 600 based on a design approach 204 that specifies procedures for creating lattices. That approach could include, for example, a lattice optimization algorithm, among other techniques for creating topology. When creating material design 600, materials engine 206 generates individual lattice members having specific thicknesses, densities, and other geometric or material attributes, in order to cause material design 600 as a whole to meet the design criteria set forth in problem specification 202. In doing so, materials engine 206 may execute a multi-objective solver, parametric variation algorithm, or other optimization algorithm to optimize the geometry, placement, and composition of each portion of the lattice. FIG. 7 illustrates another exemplary approach to generating a custom material.

FIG. 7 illustrates a material design created using a composite skin approach, according to various embodiments of the present invention. As shown, a material design 700 includes various layers 710, 720, 730, 740, and 750 deposited between planes 410 and 420. Each layer is associated with a specific thickness. Layer 710 has a thickness t1, layer 720 has a thickness t2, layer 730 has a thickness t3, layer 740 has a thickness t4, and layer 750 has a thickness t5.

Materials engine 206 generates material design 700 based on a design approach 204 that specifies procedures for arranging different layers of materials. When creating material design 700, materials engine 206 may execute a parameter variation algorithm to vary the number, thickness, and placement of each layer, as well as the specific material used for each layer. By varying these parameters in this manner, materials engine 206 may cause material design 700 as a whole to meet the design criteria set forth in problem specification 202. In doing so, materials engine 206 may execute a multi-objective solver or other optimization algorithm to optimize the geometry, placement, and composition of each layer. FIG. 8 illustrates another exemplary approach to generating a custom material.

FIG. 8 illustrates a material design created using a unit cell approach, according to various embodiments of the present invention. As shown, a material design 800 includes an array of instances of unit cell 810. Unit cell 810 is a 3D microstructure that can be created from any material or combination of materials. Each instance of unit cell 810 may be created with widely varying geometry. For example, different instances of unit cell 810 may have appendages of different thicknesses, among other geometric variations. Persons skilled in the art will also understand that unit cell 810 represents just one exemplary unit cell geometry, and that other geometries also fall within the scope of the invention.

Materials engine 206 generates material design 800 based on a design approach 204 that specifies procedures for creating and arranging individual instances of unit cell 810. When creating material design 800, materials engine 206 arranges unit cells 810 in the manner shown, and then varies different parameters associated with each unit cell instance, including geometric and material parameters. Materials engine 206 performs this variation to cause material design 800 as a whole to meet the design criteria set forth in problem specification 202. In doing so, materials engine 206 may execute a multi-objective solver or other optimization or parameter variation algorithm to optimize the geometry, placement, and composition of each unit cell instance.

Material design 800 represents one approach to generating a custom material having a gradient of material attributes across a distance. For example, material design 800 could have a gradient of strength values from the left-hand side of material design 800 to the right-hand side. Generally, each custom material discussed herein may have any technically feasible gradient of any material attribute across any axis.

Referring generally to FIGS. 6-8, these different design approaches and associated material designs are discussed herein to demonstrate how custom materials can be designed to have particular material attributes and to meet specific design criteria. These examples in now way limit the scope of the present invention. In practice, setup engine 200 may select from a wide variety of different design approaches in order to create material designs. Those material designs could prescribe any technically feasible combination of polymers, metals, glasses, rubbers, or any other type of material. In addition, persons skilled in the art will understand that material designs 600, 700, and 800 described above in conjunction with FIGS. 6, 7, and 8, respectively, are depicted in a manner that illustrates the material each design represents. As discussed, each material design includes, among other things, instructions for fabricating the associated material.

In one embodiment, materials engine 206 is configured to generate custom materials 210 at voxel-level resolution by placing individual materials on a voxel-by-voxel basis. In doing so, materials engine 206 may execute a parameter variation algorithm to vary the specific material placed at each voxel location, and then simulate each generated result to identify materials that meet the design criteria. In practice, however, in order to reduce the number of candidate materials to be simulated, materials engine 206 relies on design solutions that constrain the custom material to having particular internal geometry. The various techniques described thus far are also described in stepwise fashion below in conjunction with FIG. 9.

Figure 9:
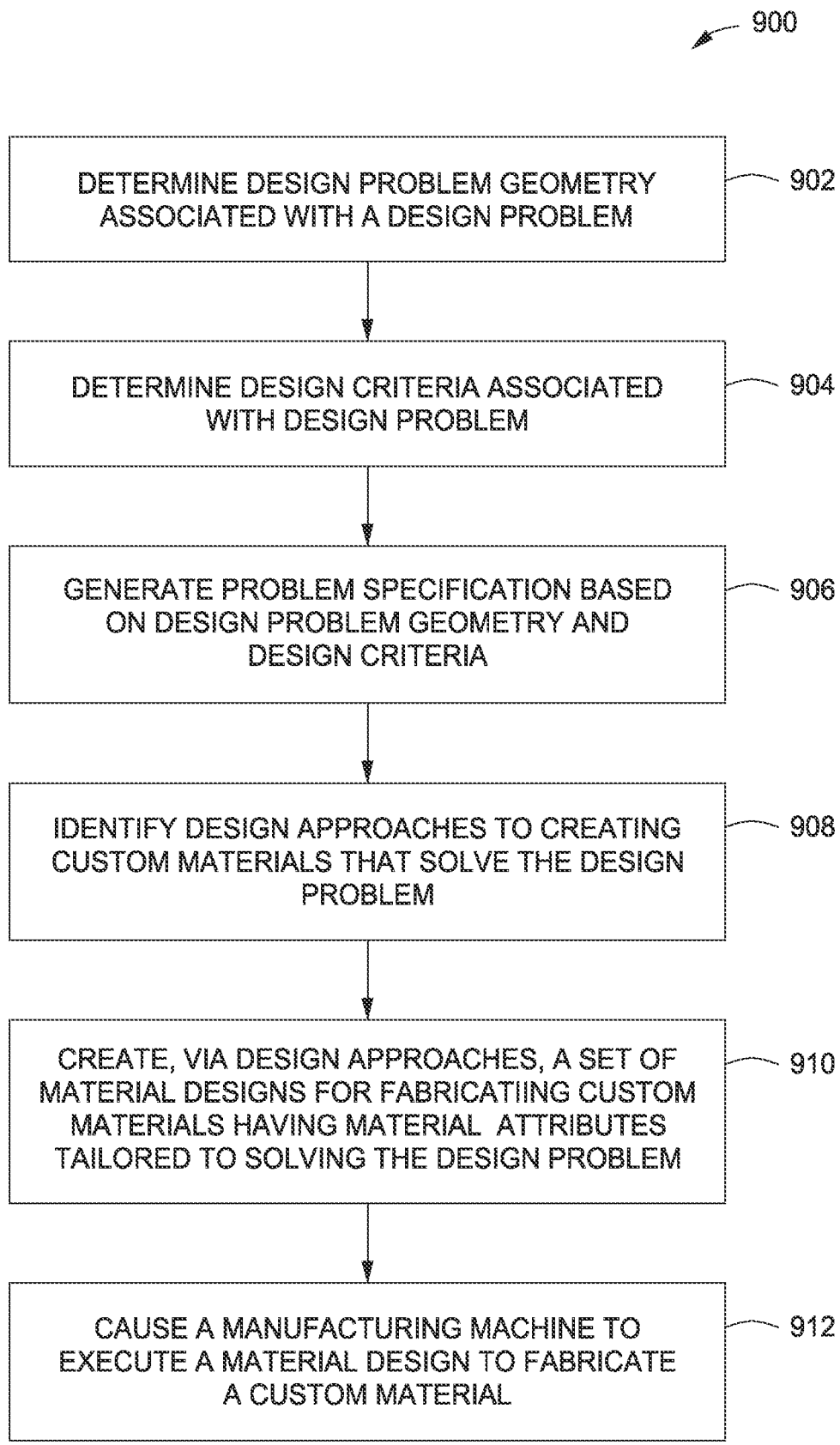
FIG. 9 is a flow diagram of method steps for creating a custom material to meet design criteria associated with a design problem, according to various embodiments of the present invention.

FIG. 9 is a flow diagram of method steps for creating geometry from a custom material to meet design criteria associated with a design problem, according to various embodiments of the present invention. Although the method steps are described in conjunction with the systems of FIGS. 1-8, persons skilled in the art will understand that any system configured to perform the method steps, in any order, is within the scope of the present invention.

As shown, a method 900 begins at step 902 where setup engine 200 determines design problem geometry associated with a design problem. Setup engine 200 provides various tools that allow the end-user to define the design problem within a design space associated with a simulated 3D environment. The end-user may interact with setup engine 200, via GUI 216, to define design problem geometry. At step 904, setup engine 200 determines design criteria associated with the design problem. The design criteria could be, for example, boundary conditions, design constraints, design objectives, and so forth.

At step 906, setup engine 200 synthesizes problem specification 202 based on the design problem geometry determined at step 902 and the design criteria determined at step 904. Problem specification 202 is a data structure that embodies all of the design problem information received via interactions with the end-user. For example, problem specification 202 could reflect a 3D environment that includes specific locations where certain forces are to be supported, within precise volumetric constraints, under particular weight limitations.

At step 908, setup engine 200 analyzes problem specification 202 and then identifies design approaches 204 to creating custom materials that solve the design problem. A given design approach 204 represents a procedure for creating a design of a material having specific material attributes and/or combinations of attributes, as set forth above in conjunction with FIGS. 6-8. Setup engine 200 identifies particular design approaches 204 that can be used to create material designs for use in manufacturing custom materials that solves the design problem outlined in problem specification 202.

At step 910, materials engine 206 executes the design approaches identified in step 908 to create a set of material designs for fabricating custom materials. Each material design 210 represents instructions for generating a custom material via manufacturing machine 220. When generating material designs 210, materials engine 206 may generate a wide range of possible design candidates, and then simulate each such candidate via simulation engine 212. Simulation engine 212 relies on materials data 208 to perform simulations. Materials data 208 defines various attributes of existing materials, including density, thermal conductivity, strength, hardness, Young's modulus, Poisson Ratio, ductility, and so forth. In one embodiment, at step 910 materials engine 206 generates both material designs 210 and design geometry that can be composed of specific custom materials. In this manner, materials engine 206 may generate a combination of geometry and material that meets the design criteria set forth in problem specification 202.

At step 912, design application 120 causes manufacturing machine 220 to execute a material design 210 to fabricate a custom material 222. A given material design 210 may include instructions that can be processed by manufacturing machine 220. Manufacturing machine 220 may combine any amount of different types of metals, polymers, rubbers, glasses, and other materials, in any structural fashion, to create a custom material 222.

In sum, a design application is configured to determine design problem geometry and design criteria associated with a design problem to be solved. Based on this information, the design application identifies one or more design approaches to creating a custom material having specific material attributes needed to solve the design problem. The design application then executes the design approaches to create material designs that reflect one or more custom materials. With these designs as input, a manufacturing machine may then construct physical instances of those custom materials. A given custom material may have a unique combination of material attributes potentially not found among existing materials. Additionally, a design fabricated from a custom material may better satisfy the design criteria than a design fabricated from a known material.

At least one advantage of the approach discussed herein is that engineers no longer need to rely solely on pre-existing materials when creating designs to solve specific design problems. Instead, the disclosed approach allows the design specification to drive the generation of custom materials optimized for use in feasible design options. This new paradigm may streamline the design process by reducing the number of iterations required to generate a feasible design and select an appropriate material. Thus, engineers may be capable of manufacturing designs that meet design criteria at a much higher rate than previously possible.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. One or more non-transitory computer-readable media including instructions that, when executed by one or more processors, cause the one or more processors to fabricate a custom material, by performing the steps of:
   determining, based on applying one or more design approaches to a design problem described in a problem specification, a set of material attributes that satisfies at least one design criterion associated with a design problem;
   generating a plurality of candidate material designs that have the set of material attributes, wherein a first candidate material design in the plurality of candidate material designs includes a custom material formed from two or more pre-existing materials;
   selecting the first candidate material design from the plurality of candidate material designs;
   generating instructions for fabricating the custom material from two or more pre-existing materials; and
   displaying, via a graphical user interface (GUI), a design space that includes:
      one or more components of the design problem, and
      a custom material geometry representing a repeatable pattern of the custom material, wherein the custom material geometry includes component geometries for each of the two or more pre-existing materials that combine to form the custom material; and
   causing, based on the material design, a manufacturing machine to fabricate the custom material from the two or more pre-existing materials by fabricating the custom material geometry.

2. The one or more non-transitory computer-readable media of claim 1, further comprising instructions that, when executed by the one or more processors, cause the one or more processors to perform the step of generating the problem specification by:
   synthesizing the custom material geometry; and
   identifying the at least one design criterion that includes at least one of a design objective, a design constraint, or a boundary condition associated with the design problem.

3. The one or more non-transitory computer-readable media of claim 1, wherein generating the set of candidate material comprises:
   identifying a set of material attributes associated with a simulated material that satisfies the at least one design criterion; and
   generating, based on the problem specification, a plurality of candidate material designs that include the set of material attributes, wherein each candidate material design includes in the plurality of candidate material designs produces the simulated material from two or more pre-existing materials.

4. The one or more non-transitory computer-readable media of claim 3, wherein generating the plurality of candidate material designs comprises:
   identifying, within a database and based on the problem specification, a first design approach included in the one or more design approaches that includes a procedure for generating the custom material geometry for the first candidate material design included in the plurality of candidate material designs; and
   performing a topology generation procedure included in the first design approach to generate the custom material geometry.

5. The one or more non-transitory computer-readable media of claim 1, wherein the first candidate material design includes a set of commands for causing the manufacturing machine to combine a first material and a second material to fabricate the custom material geometry.

6. The one or more non-transitory computer-readable media of claim 5, wherein displaying the custom material geometry comprises:
   displaying a first lattice composed of the first material; and
   displaying a second lattice interleaved with the first lattice and composed of the second material.

7. The one or more non-transitory computer-readable media of claim 5, wherein displaying the custom material geometry comprises:
   displaying a first layer composed of the first material and having a first thickness; and
   displaying a second layer disposed on the first layer and composed of the second material and having a second thickness.

8. The one or more non-transitory computer-readable media of claim 5, wherein displaying the custom material geometry comprises:

displaying the first material that comprises a first metal, and displaying the second material that comprises a second metal, wherein the custom material comprises a custom metal alloy.

9. The one or more non-transitory computer-readable media of claim 1, wherein:

the first candidate material design includes a set of commands for causing the manufacturing machine to generate an array of unit cell instances within the custom material geometry, and at least two unit cell instances in the array of unit cell instances have different geometries and are composed of different materials.

10. The one or more non-transitory computer-readable media of claim 1, wherein the custom material is associated with a first set of material attributes that is different than combinations of material attributes associated with either of the two or more pre-existing materials.

11. A computer-implemented method for fabricating a custom material, the method comprising:

determining, based on applying one or more design approaches to a design problem described in a problem specification, a set of material attributes that satisfies at least one design criterion associated with a design problem;

generating a plurality of candidate material designs that have the set of material attributes, wherein a first candidate material design in the plurality of candidate material designs includes a custom material formed from two or more pre-existing materials;

selecting the first candidate material design from the plurality of candidate material designs;

generating instructions for fabricating the custom material from two or more pre-existing materials; and displaying, via a graphical user interface (GUI), a design space that includes:

one or more components of the design problem, and a custom material geometry representing a repeatable pattern of the custom material, wherein the custom material geometry includes component geometries for each of the two or more pre-existing materials that combine to form the custom material; and causing, based on the material design, a manufacturing machine to fabricate the custom material from the two or more pre-existing materials by fabricating the custom material geometry.

12. The computer-implemented method of claim 11, further comprising generating the problem specification by:

synthesizing the custom material geometry; and identifying the at least one design criterion that includes at least one of a design objective, a design constraint, or a boundary condition associated with the design problem.

13. The computer-implemented method of claim 11, wherein generating the set of candidate material designs comprises:

identifying a set of material attributes associated with a simulated material that satisfies the at least one design criterion; and generating, based on the problem specification, a plurality of candidate material designs that include the set of material attributes, wherein each candidate material design includes in the plurality of candidate material designs produces the simulated material from two or more pre-existing materials.

14. The computer-implemented method of claim 13, wherein generating the plurality of candidate material designs comprises:

identifying, within a database and based on the problem specification, a first design approach included in the one or more design approaches that includes a procedure for generating the custom material geometry for the first candidate material design included in the plurality of candidate material designs; and performing a topology generation procedure included in the first design approach to generate the custom material geometry.

15. The computer-implemented method of claim 11, wherein the first candidate material design includes a set of commands for causing the manufacturing machine to combine a first material and a second material to fabricate the custom material geometry.

16. The computer-implemented method of claim 15, wherein displaying the custom material geometry comprises:

displaying a first lattice composed of the first material; and displaying a second lattice interleaved with the first lattice and composed of the second material.

17. The computer-implemented method of claim 15, wherein displaying the custom material geometry comprises:

displaying a first layer composed of the first material and having a first thickness; and displaying a second layer disposed on the first layer and composed of the second material and having a second thickness.

18. The computer-implemented method of claim 15, wherein displaying the custom material geometry comprises:

displaying the first material that comprises a first metal, and displaying the second material that comprises a second metal, wherein the custom material comprises a custom metal alloy.

19. The computer-implemented method of claim 11, wherein:

the first candidate material design includes a set of commands for causing the manufacturing machine to generate an array of unit cell instances within the custom material geometry, and at least two unit cell instances in the array of unit cell instances have different geometries and are composed of different materials.

20. The computer-implemented method of claim 11, wherein the custom material is associated with a first set of material attributes that is different than combinations of material attributes associated with either of the two or more pre-existing materials.

21. A system for fabricating a custom material, comprising:

a memory storing a design application; and a processor that executes the design application to:

determine, based on applying one or more design approaches to a design problem described in a problem specification, a set of material attributes that satisfies at least one design criterion associated with a design problem;

generate a plurality of candidate material designs that have the set of material attributes, wherein a first candidate material design in the plurality of candidate material designs includes a custom material formed from two or more pre-existing materials;
select the first candidate material design from the plurality of candidate material designs;
generate instructions for fabricating the custom material from two or more pre-existing materials; and
display, via a graphical user interface (GUI), a design space that includes:
  one or more components of the design problem, and
  a custom material geometry representing a repeatable pattern of the custom material, wherein the custom material geometry includes component geometries for each of the two or more pre-existing materials that combine to form the custom material; and
cause, based on the material design, a manufacturing machine to fabricate the custom material from the two or more pre-existing materials by fabricating the custom material geometry.

* * * * *

UNITED STATES PATENT AND TRADEMARK OFFICE
CERTIFICATE OF CORRECTION

PATENT NO. : 11,003,807 B2  
APPLICATION NO. : 14/951366  
DATED : May 11, 2021  
INVENTOR(S) : Mark Thomas Davis and Michael Bergin Page 1 of 1

It is certified that error appears in the above-identified patent and that said Letters Patent is hereby corrected as shown below:

On the Title Page

(56) References Cited:
Please delete "Lager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12." and insert -- Flager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12.--;

In the Claims

Column 12, Claim 3, Line 23, please insert --designs-- after material.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*